(12) United States Patent
Sun

(10) Patent No.: US 6,811,615 B2
(45) Date of Patent: Nov. 2, 2004

(54) PHOTO-ASSISTED CHEMICAL CLEANING AND LASER ABLATION CLEANING OF PROCESS CHAMBER

(75) Inventor: Sheng Sun, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 396 days.

(21) Appl. No.: 09/866,171

(22) Filed: May 24, 2001

(65) Prior Publication Data

US 2002/0189636 A1 Dec. 19, 2002

(51) Int. Cl.[7] .................................................. B08B 7/00

(52) U.S. Cl. ........................... 134/1; 134/1.1; 134/21.1; 134/22.18; 438/905

(58) Field of Search ............................... 134/1, 1.1, 1.2, 134/22.1, 22.18; 438/905

(56) References Cited

U.S. PATENT DOCUMENTS

| | | | | |
|---|---|---|---|---|
| 5,531,857 A | * | 7/1996 | Engelsberg et al. | 156/345.5 |
| 5,821,175 A | * | 10/1998 | Engelsberg | 438/795 |
| 6,055,927 A | | 5/2000 | Shang et al. | 118/723 |
| 6,095,085 A | * | 8/2000 | Agarwal | 118/723 MP |
| 6,098,637 A | * | 8/2000 | Parke | 134/1.1 |
| 6,150,265 A | * | 11/2000 | Thakur | 438/676 |
| 6,153,529 A | * | 11/2000 | Agarwal | 438/708 |
| 6,178,973 B1 | * | 1/2001 | Franca et al. | 134/1.3 |
| 6,576,564 B2 | * | 6/2003 | Agarwal | 438/758 |

* cited by examiner

Primary Examiner—Alexander Markoff
(74) Attorney, Agent, or Firm—Moser, Patterson & Sheridan LLP

(57) ABSTRACT

Provided herein is a method for cleaning a process chamber by employing high power density light beam(s) to assist dissociating cleaning gaseous species at the cleaning site. Also provided herein is a method for cleaning the process chamber with laser ablation, wherein no cleaning gas is necessary.

65 Claims, 2 Drawing Sheets

PHOTO-ASSISTED CHEMICAL CLEANING AND LASER ABLATION CLEANING OF PROCESS CHAMBER

BACKGROUND OF THE INVENTION

1. Field of the Invention

The present invention relates generally to the field of semiconductor manufacturing. More specifically, the present invention relates to methods for cleaning a process chamber by photo-assisted chemical cleaning or laser ablation.

2. Description of the Related Art

An important way to improve quality and overall efficiency in fabricating devices is to clean the chamber effectively and economically. During processing, reactive gases released inside the process chamber form layers such as silicon oxides or nitrides on the surface of a substrate being processed. Undesirable deposition occurs elsewhere in the process apparatus, for example, in the area between the gas mixing box and gas distribution manifold. Undesired residues also may be deposited in or around the exhaust channel, the liners and walls of the process chamber during such processes.

Over time, failure to clean the residue from the process apparatus often results in degraded, unreliable processes and defective substrates. Without frequent cleaning procedures, impurities from the residue built up in the process apparatus can migrate onto the substrate. The problem of impurities causing damage to the devices on the substrate is of particular concern with today's increasingly small device dimensions. Thus, process system maintenance is important for the smooth operation of substrate processing, as well as for improved device yield and better product performance.

Frequently, periodic chamber cleaning between processing of every Nth substrate is desired to improve process system performance in producing high quality devices. Providing an efficient, non-damaging cleaning of the chamber and/or substrate can enhance performance and quality of the devices produced. Two methods of cleaning a process chamber in the art are in situ cleaning (also known as dry-etch cleaning) and wet cleaning. In an in-situ cleaning operation, process gases are evacuated from the process chamber and one or more cleaning gases are introduced. Energy is then applied to promote a reaction between the gases and any residues that may have accumulated on the process chamber's interior surfaces. Residues on the process chamber's interior react with the cleaning gases, forming gaseous by-products that are then exhausted from the process chamber, along with non-reacted portions of the cleaning gases. The cleaning process is followed by the resumption of normal processing.

In contrast to an in situ cleaning procedure, in which the process chamber remains sealed, a wet cleaning procedure is performed by breaking the process chamber's vacuum seal and manually wiping down the chamber's interior surfaces. A wet cleaning procedure is normally performed to remove residues that are not entirely removed by the in situ cleaning process, and thus slowly accumulate over time. A solvent is sometimes used to dissolve these residues. Once cleaned, the process chamber is sealed and normal processing is resumed.

Unfortunately, such cleaning operations affect a substrate process system's throughput in a variety of ways. For example, system throughput is reduced by the time involved in performing cleaning operations. In an in situ cleaning process, time is spent evacuating process gases from, and introducing/evacuating the cleaning gases into/from the process chamber. Flow rates, plasma power levels, temperature, pressure, and other cleaning process conditions must also be reset to desired levels after the cleaning process is completed. When a wet clean is performed, opening the process chamber and physically wiping the chamber's interior surfaces results in even more downtime because the process must subsequently be re-stabilized. It is thus desirable to reduce the frequency with which such cleaning operations are performed.

Additionally, frequent cleaning operations tend to increase wear on the process chamber components. For example, in-situ cleaning is typically performed using fluoridated carbons (e.g., $CF_4$, $C_2F_6$ and the like) or similar fluorine-containing gases (e.g., $NF_3$ and the like) due to their highly reactive nature. Unfortunately, exposure to plasmas created from such gases often causes the deterioration of process chamber components. This increased wear can lead to component failure, thereby causing extended downtime, and adversely affecting process system throughput.

The use of reactive gases in cleaning process chambers, however, also suffers from a further disadvantage. The same species that provide desirable cleaning characteristics may themselves cause the formation of residues. For example, the use of such gases can cause the accumulation of polymer residues, which also exhibit undesirable qualities. The addition of oxygen to the cleaning process gas may reduce the formation of such polymer residues. In particular, ozone or an oxygen/ozone mixture may provide the desired reduction in polymer formation while speeding the cleaning process, due to ozone's greater reactivity.

Another example of residues generated by cleaning gases are the cleaning residues often formed by the use of fluoridated compounds in certain cleaning processes. These compounds may react with the aluminum or anodized aluminum which makes up many of the standard process chamber's components to form an aluminum fluoride residue on the interior surfaces of the chamber and the chamber's components. The reaction between the aluminum and the fluorine-containing compounds often occurs because the residues within the process chamber vary in thickness and therefore have different cleaning times. Thus, certain areas of the process chamber's interior may become residue-free (i.e., exposed) before others, resulting in the formation of an aluminum fluoride residue on the exposed portions of the chamber's interior.

Therefore, the prior art is deficient in the lack of effective means of cleaning a process chamber or process chamber parts Specifically, the prior art is deficient in the lack of effective means of photo-assisted chemical cleaning of a process chamber or of laser ablation cleaning of a process chamber parts. The present invention fulfills these long-standing needs and desires in the art.

SUMMARY OF THE INVENTION

One embodiment of the present invention is a method for cleaning a process chamber, comprising the steps of introducing at least one cleaning gas to the process chamber via a section connected to the process chamber; and applying at least one high power density light beam to the section or to the process chamber, wherein the high power density light beam(s) assists dissociation of the cleaning gas in either the section or the process chamber, thereby achieving cleaning activity of the cleaning gas in the process chamber.

Another embodiment of the present invention provides a method for cleaning a process chamber, comprising the steps of introducing at least one halogen-containing cleaning gas to the process chamber via a section connected to the process chamber; and applying at least one high power density light beam comprising an incoherent light beam or a laser light beam to the section or to the process chamber, wherein the high power density light beam(s) assists dissociation of the halogen-containing cleaning gas in either the section or the process chamber, thereby achieving cleaning activity of the halogen-containing cleaning gas in the process chamber.

Yet another embodiment of the present invention is a method for cleaning a process chamber, comprising the steps of introducing at least one fluorine-containing cleaning gas to the process chamber via a section connected to the process chamber; and applying at least one high power density laser beam having a wavelength range from about 190 nm to about 10 $\mu$m and an energy density range from about 1 W/mm$^2$ to about 2 MW/mm$^2$ to the section or to the process chamber, wherein the high power density laser beam(s) assists dissociation of the fluorine-containing cleaning gas in either the section or the process chamber, thereby achieving cleaning activity of the fluorine-containing cleaning gas in the process chamber.

Another embodiment of the present invention is a method for cleaning a process chamber, comprising the steps of introducing at least one precursor gas to the process chamber via a section connected to the chamber; applying at least one high power density light beam to the section or directly to the process chamber; and applying a plasma to the process chamber, wherein the plasma activates the precursor gas to generate reactive species, and wherein the high power density light beam(s) assists dissociation of the reactive species, thereby cleaning the process chamber.

Yet another embodiment of the present invention is a method for cleaning a process chamber, comprising the steps of introducing at least one halogen-containing precursor gas to the process chamber via a section connected to the process chamber; applying at least one high power density light beam comprising an incoherent light beam or a laser light beam to the section or directly to the process chamber; and applying a plasma to the process chamber, wherein the plasma activates the precursor gas to generate reactive species, and wherein the high power density light beam(s) assists dissociation of the reactive species, thereby cleaning the process chamber.

Yet another embodiment of the present invention is a method for cleaning a process chamber, comprising the steps of introducing at least one fluorine-containing precursor gas to the process chamber via a section connected to the process chamber; applying at least one high power density laser beam having a wavelength range from about 190 nm to about 10 $\mu$m and an energy density range from about 1 W/mm$^2$ to about 2 MW/mm$^2$ to the section or directly to the process chamber; and applying a plasma to the process chamber, wherein the plasma activates the fluorine-containing precursor gas to generate reactive species, and wherein the high power density laser beam(s) assists dissociation of the reactive species, thereby cleaning the process chamber.

Yet another embodiment of the present invention is a method for cleaning a process chamber, comprising the steps of introducing at least one precursor gas to a remote chamber, wherein the remote chamber is connected to the interior of the process chamber; activating the precursor gas in the remote chamber to generate reactive species; introducing the reactive species to the process chamber via a section connected to the chamber; and applying at least one high power density light beam to the section, wherein the high power density light beam(s) assists dissociation of the reactive species, thereby cleaning the process chamber.

In yet another embodiment of the present invention there is provided a method for cleaning a process chamber, comprising the steps of introducing at least one halogen-containing precursor gas to a remote chamber, wherein the remote chamber is connected to the interior of the process chamber; activating the halogen-containing precursor gas in the remote chamber to generate reactive species; introducing the reactive species to the process chamber via a section connected to the chamber; and applying at least one high power density light beam comprising an incoherent light beam or a laser light beam to the section, wherein the high power density light beam(s) assists dissociation of the reactive species, thereby cleaning the process chamber.

In yet another embodiment of the present invention there is provided a method for cleaning a process chamber, comprising the steps of introducing at least one fluorine-containing precursor gas to a remote chamber, wherein the remote chamber is connected to the interior of the process chamber; activating the fluorine-containing precursor gas in the remote chamber to generate reactive species; introducing the reactive species to the process chamber via a section connected to the chamber; and applying at least one high power density laser beam having a wavelength range from about 190 nm to about 10 $\mu$m and an energy density range from about 1 W/mm$^2$ to about 2 MW/mm$^2$ to the section, wherein the high power density laser beam(s) assists dissociation of the reactive species, thereby cleaning the process chamber.

In yet another embodiment of the present invention there is provided a method for cleaning a process chamber, comprising the steps of irradiating at least one laser beam to the interior of the process chamber, wherein the laser beam(s) ablates residues from the process chamber; and removing the process residues from the process chamber by at least one carrier gas, thereby cleaning the process chamber.

In yet another embodiment of the present invention there is provided a method for cleaning a process chamber, comprising the steps of irradiating at least one laser beam having a wavelength range from about 190 nm to about 10 $\mu$m and an energy density range from about 1 W/mm$^2$ to about 2 MW/mm$^2$ to the interior of the process chamber, wherein the laser beam(s) ablates residues from the process chamber; and removing the process residues from the process chamber by at least one carrier gas, thereby cleaning the process chamber.

Other and further aspects, features, and advantages of the present invention will be apparent from the following description of the embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate embodiments of the invention and therefore are not to be considered limiting in their scope.

DETAILED DESCRIPTION OF THE INVENTION

Figure 1:
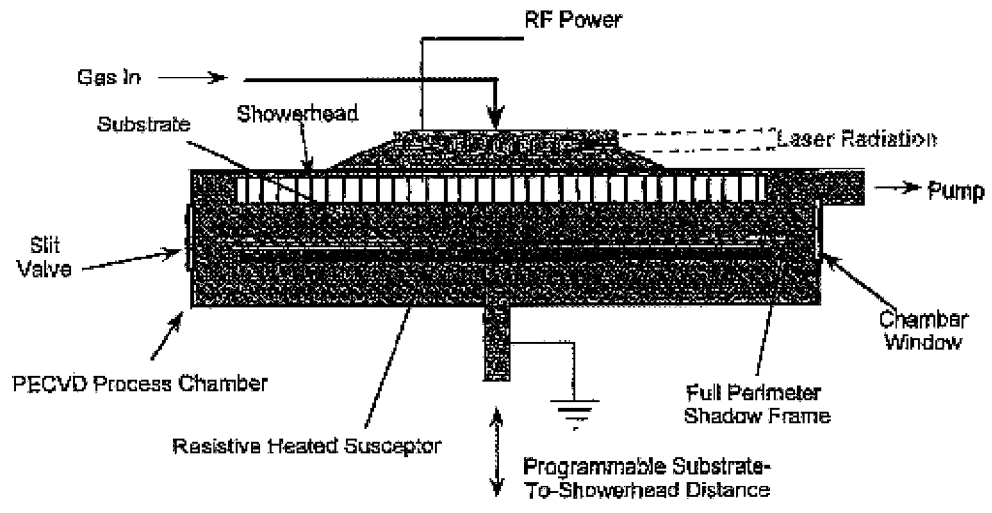
FIG. 1 is a schematic diagram of photo-assisted process chamber cleaning in accordance with one embodiment of the invention. In this scheme, a cleaning gas is introduced via a section on top of the chamber before reaching the showerhead. High-power light (laser) radiation is also applied to this section, which could be of a sheet form or a rectangular section.

One embodiment of the present invention is a method for cleaning a process chamber, comprising the steps of introducing at least one cleaning gas to the process chamber via a section connected to the process chamber; and applying at least one high power density light beam to the section or to the process chamber, wherein the high power density light beam(s) assists dissociation of the cleaning gas in either the section or the process chamber, thereby achieving cleaning activity of the cleaning gas in the process chamber. The section may be connected to the top of process chamber. The cleaning gas may be a fluorine-containing gas, a chlorine-containing gas or other halogen-containing gases. Representative examples of fluorine-containing gas include $F_2$, $NF_3$, $SF_6$, $C_2F_6$, $CF_4$, $C_3F_8$, and HF.

The high power density light used in this embodiment generally has a wavelength range from about 190 nm to about 10 $\mu$m and has an energy density range from about 1 W/mm$^2$ to about 2 MW/mm$^2$. In one aspect of this embodiment an incoherent light beam(s) is employed. In an additional aspect a laser light beam(s) is employed. The laser light may be continuous or pulsed beam(s) and, further, may be focused or expanded beams.

The present invention is also directed to a method for cleaning a process chamber, comprising the steps of introducing at least one halogen-containing cleaning gas to the process chamber via a section connected to the process chamber; and applying at least one high power density light beam comprising an incoherent light beam or a laser light beam to the section or to the process chamber, wherein the high power density light beam(s) assists dissociation of the halogen-containing cleaning gas in either the section or the process chamber, thereby achieving cleaning activity of the halogen-containing cleaning gas in the process chamber. The section may be connected to the top of process chamber. The cleaning gas may be a fluorine-containing gas or a chlorine-containing gas. Representative examples of fluorine-containing gas include $F_2$, $NF_3$, $SF_6$, $C_2F_6$, $CF_4$, $C_3F_8$, and HF. The high power density incoherent light or laser light used in this embodiment generally has a wavelength range from about 190 nm to about 10 $\mu$m and has an energy density range from about 1 W/mm$^2$ to about 2 MW/mm$^2$. The laser light may be continuous or pulsed beam(s) and, further, may be focused or expanded beams.

The present invention is also directed to a method for cleaning a process chamber, comprising the steps of introducing at least one fluorine-containing cleaning gas to the process chamber via a section connected to the process chamber; and applying at least one high power density laser beam having a wavelength range from about 190 nm to about 10 $\mu$m and an energy density range from about 1 W/mm$^2$ to about 2 MW/mm$^2$ to the section or to the process chamber, wherein the high power density laser beam(s) assists dissociation of the fluorine-containing cleaning gas in either the section or the process chamber, thereby achieving cleaning activity of the fluorine-containing cleaning gas in the process chamber. The representative examples of the specific aspects of this embodiment are as described supra.

The present invention is also directed to a method for cleaning a process chamber, comprising the steps of introducing at least one precursor gas to the process chamber via a section connected to the chamber; applying at least one high power density light beam to the section or directly to the process chamber; and applying a plasma to the process chamber, wherein the plasma activates the precursor gas to generate reactive species, and wherein the high power density light beam(s) assists dissociation of the reactive species, thereby cleaning the process chamber.

The reactive species in this embodiment may be generated from a precursor gas such as a fluorine-containing gas, a chlorine-containing gas or other halogen-containing gases. Examples of fluorine-containing gases used in the instant embodiment include $F_2$, $NF_3$, $SF_6$, $C_2F_6$, $CF_4$, $C_3F_8$, and HF. The high power density light beam(s) that assist with dissociation of the reactive species is generated from an incoherent light source or a laser light source and possesses the characteristics as disclosed supra.

The present invention is also directed to a method for cleaning a process chamber, comprising the steps of introducing at least one halogen-containing precursor gas to the process chamber via a section connected to the process chamber; applying at least one high power density light beam comprising an incoherent light beam or a laser light beam to the section or directly to the process chamber; and applying a plasma to the process chamber, wherein the plasma activates the precursor gas to generate reactive species, and wherein the high power density light beam(s) assists dissociation of the reactive species, thereby cleaning the process chamber. Representative examples of the specific aspects of this embodiment are as described supra.

The present invention is also directed to a method for cleaning a process chamber, comprising the steps of introducing at least one fluorine-containing precursor gas to the process chamber via a section connected to the process chamber; applying at least one high power density laser beam having a wavelength range from about 190 nm to about 10 $\mu$m and an energy density range from about 1 W/mm$^2$ to about 2 MW/mm$^2$ to the section or directly to the process chamber; and applying a plasma to the process chamber, wherein the plasma activates the fluorine-containing precursor gas to generate reactive species, and wherein the high power density laser beam(s) assists dissociation of the reactive species, thereby cleaning the process chamber. The representative examples of the specific aspects of this embodiment are as described supra.

The present invention is also directed to a method for cleaning a process chamber, comprising the steps of introducing at least one precursor gas to a remote chamber, wherein the remote chamber is connected to the interior of the process chamber; activating the precursor gas in the remote chamber to generate reactive species; introducing the reactive species to the process chamber via a section connected to the chamber; and applying at least one high power density light beam to the section, wherein the high power density light beam(s) assists dissociation of the reactive species, thereby cleaning the process chamber.

The reactive species in this embodiment may be generated by a precursor gas such as a fluorine-containing gas, a chlorine-containing gas or other halogen-containing gases. Examples of fluorine-containing gases used in the instant embodiment include $F_2$, $NF_3$, $SF_6$, $C_2F_6$, $CF_4$, $C_3F_8$, and HF. The high power density light beam(s) that assist with dissociation of the reactive species is generated from an incoherent light source or a laser light source and possesses the characteristics as disclosed supra.

The present invention is also directed to a method for cleaning a process chamber, comprising the steps of introducing at least one halogen-containing precursor gas to a remote chamber, wherein the remote chamber is connected to the interior of the process chamber; activating the halogen-containing precursor gas in the remote chamber to generate reactive species; introducing the reactive species to the process chamber via a section connected to the chamber; and applying at least one high power density light beam comprising an incoherent light beam or a laser light beam to the section, wherein the high power density light beam(s) assists dissociation of the reactive species, thereby cleaning the process chamber. The representative examples of the specific aspects of this embodiment are as described supra.

The present invention is also directed to a method for cleaning a process chamber, comprising the steps of introducing at least one fluorine-containing precursor gas to a remote chamber, wherein the remote chamber is connected to the interior of the process chamber; activating the fluorine-containing precursor gas in the remote chamber to generate reactive species; introducing the reactive species to the process chamber via a section connected to the chamber; and applying at least one high power density laser beam having a wavelength range from about 190 nm to about 10 $\mu$m and an energy density range from about 1 W/mm$^2$ to about 2 MW/mm$^2$ to the section, wherein the high power density laser beam(s) assists dissociation of the reactive species, thereby cleaning the process chamber. The representative examples of the specific aspects of this embodiment are as described supra.

The present invention is also directed to a method for cleaning a process chamber, comprising the steps of irradiating at least one laser beam to the interior of the process chamber, wherein the laser beam(s) ablates residues from the process chamber; and removing the process residues from the process chamber by at least one carrier gas, thereby cleaning the process chamber The laser beam used in this embodiment has a wavelength range from about 190 nm to about 10 $\mu$m and has an energy density range from about 1 kW/mm$^2$ to about 2 MW/mm$^2$. The laser light may be continuous or pulsed beam(s) and, further, may be focused or expanded beams. Representative examples of the carrier gas are hydrogen fluoride, nitrogen, hydrogen, argon and helium or may be other applicable gases.

The present invention is also directed to a method for cleaning a process chamber, comprising the steps of irradiating at least one laser beam having a wavelength range from about 190 nm to about 10 $\mu$m and an energy density range from about 1 W/mm$^2$ to about 2 MW/mm$^2$ to the interior of the process chamber, wherein the laser beam(s) ablates residues from the process chamber; and removing the process residues from the process chamber by at least one carrier gas, thereby cleaning the process chamber. The representative examples of the specific aspects of this embodiment are as described supra.

Provided herein are photo-assisted methods for cleaning a process chamber or process chamber parts. High-power light beam(s) facilitate dissociating cleaning gaseous species at the cleaning site or alternatively, the cleaning of chamber process parts can be accomplished by laser ablation wherein no cleaning gas is necessary. In particular, the cleaning means should be capable of removing the residues created during substrate processing operations, while reducing or eliminating the subsequent formation of cleaning residues such as polymers and aluminum fluoride.

More specifically, in a photo-assisted cleaning method one or multiple high power density light beams are scanned across the chamber parts' surface. Either an incoherent light source or a laser light source can be used to irradiate. In a laser light source the irradiating beams can be tightly focused to achieve a higher power density, or can be loosely expanded to cover a larger area. Additionally, the laser beam(s) can be high-power pulsed type, or continuous wave (CW) type. The laser can be frequency tuned to achieve the resonance dissociation of the reactive cleaning gas, or a single-frequency solid state laser.

Two schemes may be employed depending on the efficiency and cost-performance ratio. In one embodiment, the light beam is the only energy source for the cleaning gas dissociation. In this case, high power density is required for the high dissociation efficiency. In a second example, regular in-situ plasma cleaning or remote plasma source cleaning (RPSC) is employed for the dissociation of the majority of the cleaning gas. As such, the light beam is only used in assisting the in-situ plasma cleaning or remote plasma source cleaning to achieve higher dissociation efficiency, a faster clean rate and a reduction in the cleaning gas consumption.

Additionally, a process chamber or the surface of the parts thereof may be cleaned by laser ablation, wherein no cleaning gas is necessary. Laser ablation, which has been well characterized academically and applied in other industries, can be applied to clean the process chamber(s) in semiconductor/flat panel display (FPD) manufacturing processes.

The following examples are given for the purpose of illustrating various embodiments of the invention and are not meant to limit the present invention in any fashion.

EXAMPLE 1

Selection of Irradiation Source

Selection of the source of irradiation used in the invention depends upon the desired radiation energy and wavelength. The preferred wavelength depends on the molecular species being removed and the resonance states of such species. The radiation may comprise incoherent light or laser light. Any means known in the art for generating radiation of a suitable energy level may be used in the invention, including high-energy lamps and lasers. Depending upon the application, it is anticipated that light energy from such sources may range from deep ultraviolet to infrared, with corresponding wavelengths from 193 nm to 10 $\mu$m. Pulsed or continuous wave type laser beams may be applied. The beams may be focused or expanded. The wavelengths and photon energies of a number of suitable lasers are listed in Table 1.

TABLE 1

| Laser | Wavelength (nm) | Ev/photon |
|---|---|---|
| XeCl, pulsed | 308 | 4.04 |
| argon-ion, continuous wave | 257 | 4.83 |
| KrF, pulsed | 248 | 5.01 |
| ArF, pulsed | 193 | 6.44 |
| Tunable dye lasers, pulsed or continuous wave | 200–800 | 6.22–1.55 |
| $CO_2$ laser | 10600 | 0.12 |

These lasers are described in greater detail in the following references: M. J. Webber, ed., CRC Handbook of Laser Science, Vols. 1-5 (1982-1987); Mitsuo Maeda, Laser Dyes (Academic Press 1984); and laser product literature from Lambda Physik at Acton, Mass., Coherent, Inc. at Palo Alto, Calif., and Spectra-Physics at Mountain View, Calif. It is anticipated that high-energy xenon or mercury lamps or other types of lasers, including visible, ultraviolet, infrared, x-ray or free electron lasers might be utilized as appropriate sources of radiation.

EXAMPLE 2
Photo-Assisted Chemical Cleaning of a Process Chamber

High power density light beams are applied to dissociate a cleaning gas thereby effecting cleaning of a process chamber or the process chamber parts' surface where required. The wavelength may range from 190 nm to about 10 μm, and the power density may range from 1 $W/mm^2$ to 2 $MW/mm^2$. For example, in a photo-assisted cleaning process requiring about 5 kW of power and with the cross section of a representative light beam at about 1 cm ×50 cm, the power density is 1 $W/mm^2$.

These high power light beams can provide the sole energy source for the cleaning gas dissociation. A cleaning gas is introduced to the chamber via a section optionally connected to the chamber before reaching the showerhead (FIG. 1). The high power density light beams can dissociate the cleaning gas either in the section upstream from the process chamber or alternatively downstream upon entry of the cleaning gas through the showerhead to the process chamber insofar as the cleaning gas is fully dissociated immediately prior to the point-of-use.

This section has high-power light radiation, which can be of a sheet form or a rectangular section. The light radiation may be of multiple beams, and placed at various locations for the best cleaning efficiency. The section may optionally be installed elsewhere than on top of the chamber. However dissociating the cleaning gas upstream before it reaches the film-deposited areas in the process chamber, i.e., in the section prior to distribution through the showerhead, is significantly more efficient. A fluorine-containing gas, a chlorine-containing gas or other halogen-containing gases may be used as the cleaning gas. For example, a fluorine-containing gas such as HF, F.sub.2, NF.sub.3, SF.sub.6, C.sub.2F.sub.6 or CF.sub.4 is commonly used for cleaning.

Alternatively, in situ plasma cleaning may be employed for the dissociation of a majority of the cleaning gas, while light beams are used to assist the plasma cleaning. In such systems for cleaning the chamber and the exposed components within the chamber, precursor gases are supplied to the chamber. Then, by locally applying a glow discharge plasma to the precursor gases within the chamber, reactive species are generated. The reactive species clean the chamber surfaces by forming volatile compounds with the process residues on those surfaces. High power density light beams enhance the dissociation and generation of reactive species, thereby achieving a higher dissociation efficiency, a faster cleaning rate and a reduction in the cleaning gas consumption.

Figure 2:
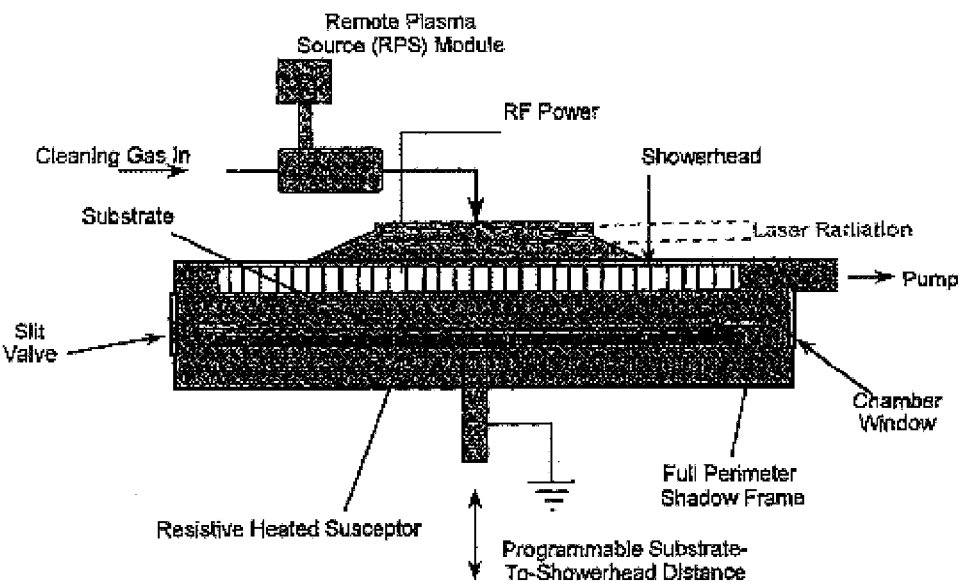
FIG. 2 is a schematic diagram of photo-assisted process chamber cleaning with remote plasma source cleaning (RPSC) in accordance with another embodiment of the invention. In this scheme, cleaning gas first flows through the remote plasma source region, so that the gas is activated to generate reactive radicals such as F atoms These active species are then introduced via a section on top of the chamber before reaching the showerhead. High-power light or laser radiation is also applied to this section, which could be of a sheet form or a rectangular section.

Alternatively, the plasma may be provided remotely (FIG. 2). A remote plasma source cleaning system comprises a cleaning gas source connected to a remote activation chamber. The cleaning gas source includes a source of a precursor gas, a flow control mechanism for controlling the flow of precursor gas and a conduit for flowing the gas into the remote activation chamber located outside and at a distance from the process chamber. A power activation source, for example a high-power microwave generator, is used to activate the precursor gas within the remote activation chamber.

The precursor gas may be a fluorine-containing gas, chlorine-containing gas or other halogen-containing gas, for example, NF.sub.3. To activate the precursor gas, the microwave source delivers about 3,000-12,000 Watts to the remote activation chamber. A value of 5,000 Watts may be used for many applications. Upon activation, reactive species are generated in the remote chamber, and then introduced to the process chamber via a broad cross-section conduit. High-power light radiation is also applied to this section, which could be of a sheet form or a rectangular section. The cleaning gas is fully dissociated right before point-of-use. The flow rate of the cleaning gas, such as NF3, varies with the type of chamber used. A typical process chamber pressure during cleaning is about 0.3 to about 1 Torr. The light radiation can comprise multiple beams, and they can be placed at various places for the best cleaning effect.

EXAMPLE 3
Laser Ablation Cleaning of Process Chamber Parts

Figure 3:
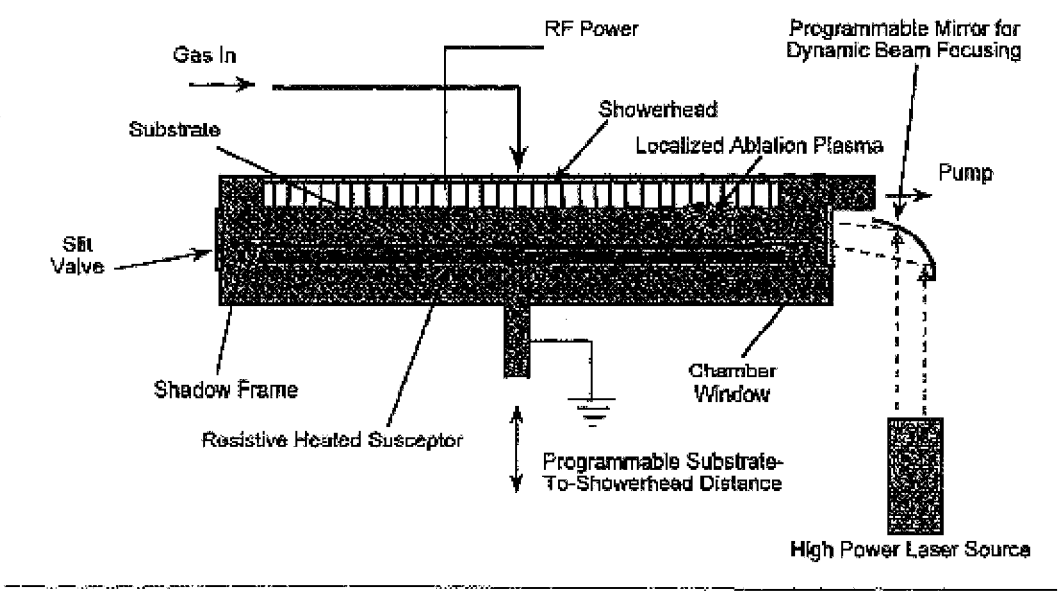
FIG. 3 is a schematic diagram of process chamber cleaning with the laser ablation technique in accordance with yet another embodiment of the invention.

A laser beam with proper wavelength and adequate energy density is irradiated to the chamber parts surface. The radiation source may be located outside the process chamber and irradiating the chamber parts through windows made of light-transmitting, chemical resistant materials, or alternatively, placed within the chamber. In this configuration (FIG. 3), expensive cleaning gases such as $NF_3$ are not necessary as laser ablation vaporize and/or defragments the film residues on the chamber parts' surface. Only carrier gases or other reduction agents such as $H_2$ are used to carry the gaseous or vaporized cleaning products to downstream areas in the chamber.

In this method, laser power density is crucial to defragment and to vaporize the film residues without causing surface damage to the chamber parts. The success of this technique has been demonstrated in other laser ablation pioneer works such as the laser cleaning and restoration of antique paintings. A well-controlled dynamic focusing beam is desirable to focus and scan the entire surface contour of the chamber parts containing film residue deposition. Multiple beam configurations may be necessary to achieve the highest cleaning efficiency. The laser wavelength ranges from about 190 nm to about 10 μm, and the power density ranges from 1 $kW/mm^2$ to 2 $MW/mm^2$.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A method for cleaning a process chamber, comprising the steps of:
   introducing at least one cleaning gas to the process chamber via a section connected to the process chamber; and
   irradiating at least one light beam to the section or to the process chamber, wherein the light beam has an energy density ranging from about 1 kW/mm² to about 2 MW/mm² and assists dissociation of the cleaning gas in either the section or the process chamber, thereby achieving cleaning activity of the cleaning gas in the process chamber.

2. The method of claim 1, wherein the section is connected on top of the process chamber.

3. The method of claim 1, wherein the cleaning gas is selected from the group consisting of a fluorine-containing gas, a chlorine-containing gas and other halogen-containing gases.

4. The method of claim 3, wherein the fluorine-containing gas is selected from the group consisting of $F_2$, $NF_3$, $SF_6$, $C_2F_6$, $CF_4$, $C_3F_8$, and HF.

5. The method of claim 1, wherein the light beam has a wavelength range from about 190 nm to about 10 μm.

6. The method of claim 1, wherein the beam comprises an incoherent light beam or a laser light beam.

7. The method of claim 6, wherein the laser beam is focused or expanded.

8. The method of claim 6, wherein the laser beam is a pulsed type or a Continuous wave type laser beam(s).

9. A method for cleaning a process chamber, comprising the steps of:
   introducing at least one halogen-containing cleaning gas to the process chamber via a section connected to the process chamber; and
   irradiating at least one light beam comprising an incoherent light beam to the section or to the process chamber, wherein the light beam assists dissociation of the halogen-containing cleaning gas in either the section or the process chamber, thereby achieving cleaning activity of the halogen-containing cleaning gas in the process chamber.

10. The method of claim 9, wherein the section is connected on top of the process chamber.

11. The method of claim 9, wherein the halogen-containing gas is a fluorine-containing gas or a chlorine-containing gas.

12. The method of claim 11, wherein the fluorine-containing gas is selected from the group consisting of $F_2$, $NF_3$, $SF_6$, $C_2F_6$, $CF_4$, $C_3F_8$, and HF.

13. The method of claim 9, wherein the light beam has a wavelength range form about 190 nm to about 10 μm.

14. The method of claim 9, wherein the light beam has an energy density range from about 1 kW/mm² to about 2 MW/mm².

15. The method of claim 9, wherein the light beam is focused or expanded.

16. The method of claim 9, wherein the light beam is a pulsed type or a continuous wave type laser beam.

17. A method for cleaning a process chamber, comprising the steps of:
   introducing at least one fluorine-containing cleaning gas to the process chamber via a section connected to the process chamber; and
   irradiating at least one laser beam having a wavelength range from about 190 nm to about 10 μm and an energy density range from about 1 kW/mm² to about 2 MW/mm² to the section or to the process chamber, wherein the laser beam assists dissociation of the fluorine-containing cleaning gas in either the section or the process chamber, thereby achieving cleaning activity of the fluorine-containing cleaning gas in the process chamber.

18. The method of claim 17, wherein the section is connected on top of the process chamber.

19. The method of claim 17, wherein the fluorine containing gas is selected from the group consisting of $F_2$, $NF_3$, $SF_6$, $C_2F_6$, $CF_4$, $C_3F_8$, and HF.

20. The method of claim 17, wherein the laser beam(s) is focused or expanded.

21. The method of claim 17, wherein the laser beam(s) is a pulsed type or a continuous wave type laser beam.

22. A method for cleaning a process chamber, comprising of steps of:
   introducing at least one precursor gas to the process chamber via a section connected to the chamber;
   applying at least one light beam to the section or directly to the process chamber, wherein the light beam has a energy density ranging from about 1 kW/mm² to about 2 MW/mm²; and
   applying a plasma to the process chamber, wherein the plasma activates the precursor gas to generate reactive species, and wherein the light beam assists dissociation of the reactive species, thereby cleaning the process chamber.

23. The method of claim 22, wherein the reactive species are generated from a precursor gas selected from the group consisting of the fluorine-containing gas, a chlorine-containing gas, and other halogen-containing gases.

24. The method of claim 23, wherein the fluorine-containing gas is selected from the group consisting of $F_2$, $NF_3$, $SF_6$, $C_2F_6$, $CF_4$, $C_3F_8$, and HF.

25. The method of claim 22, wherein the light beam has a wavelength range from about 190 nm to about 10 μm.

26. The method of claim 22, wherein the light beam comprises an incoherent light beam or a laser light beam.

27. The method of claim 26, wherein the laser light beam is focused or expanded.

28. The method of claim 26, wherein the laser light beam is a pulsed type or a continuous wave type.

29. A method for cleaning a process chamber, comprising the steps of:
   introducing at least one halogen-containing precursor gas to the process chamber via a section connected to the process chamber;
   applying at least one light beam comprising an incoherent light beam to the section or directly to the process chamber; and
   applying a plasma to the process chamber, wherein the plasma activates the precursor gas to generate reactive species, and wherein the light beam assists dissociation of the reactive species, thereby cleaning the process chamber.

30. The method of claim 29, wherein the reactive species are generated from a fluorine-containing gas or a chlorine-containing gas.

31. The method of claim 30, wherein the fluorine-containing gas is selected from the group consisting of $F_2$, $NF_3$, $SF_6$, $C_2F_6$, $C_3F_8$, and HF.

32. The method of claim 29, wherein the light beam has a wavelength range from about 190 nm to about 10 μm.

33. The method of claim 29, wherein the light beam has an energy density range from about 1 W/mm² to about 2 MW/mm².

34. The method of claim 29, wherein the light beam is focused or expanded.

35. The method of claim 29, wherein the light beam is a pulsed type or a continuous wave type.

36. A method for cleaning a process chamber, comprising:
introducing at least one fluorine-containing precursor gas to the process chamber via a section connected to the process chamber;
applying at least one laser beam having a wavelength range from about 190 nm to about 10 μm and an energy density range from about 1 kW/mm² to about 2 MW/mm² to the section or directly to the process chamber; and
applying a plasma to the process chamber, wherein the plasma activates the fluorine-containing precursor gas to generate reactive species, and wherein laser beam assists dissociation of the reactive species, thereby cleaning the process chamber.

37. The method of claim 36, wherein the fluorine-containing precursor gas is selected from the group consisting at $F_2$, $NF_3$, $SF_6$, $C_2F_6$, $CF_4$, $C_3F_8$, and HF.

38. The method of claim 36, wherein the laser light beam is focused or expanded.

39. The method of claim 36, wherein the laser light beam is a pulsed type or a continuous wave type.

40. A method for cleaning a process chamber, comprising the steps of:
introducing at least one precursor gas to a remote chamber, wherein the remote chamber is connected to the interior of the process chamber;
activating the precursor gas in the remote chamber to generate reactive species;
introducing the reactive species to the process chamber via a section connected to the chamber; and
applying at least one light beam to the section, wherein the light beam has an energy density range from about 1 kW/mm² to about 2 MW/mm² and assists dissociation of the reactive species, thereby cleaning the process chamber.

41. The method of claim 40, wherein the reactive species are generated from a precursor gas selected from the group consisting of a fluorine-containing gas, a chlorine-containing gas and other halogen-containing gases.

42. The method of claim 41, wherein the fluorine-containing gas is selected from the group consisting of $F_2$, $NF_3$, $SF_6$, $C_2F_6$, $CF_4$, $C_3F_8$, and HF.

43. The method of claim 40, wherein the light beam has a wavelength range from about 190 nm to about 10 μm.

44. The method of claim 40, wherein the light beam comprises an incoherent light beam or a laser light beam.

45. The method of claim 44, wherein the laser light beam is focused or expanded.

46. The method of claim 44, wherein the laser light beam is a pulsed type or a continuous wave type.

47. A method for cleaning a process chamber, comprising the steps of:
introducing at least one halogen-containing precursor gas to a remote chamber, wherein the remote chamber is connected to the interior of the process chamber;
activating the halogen-containing precursor gas in the remote chamber to generate reactive species;
introducing the reactive species to the process chamber via a section connected to the chamber; and
applying at least one light beam comprising an incoherent light beam to the section, wherein the light beam assists dissociation of the reactive species, thereby cleaning the process chamber.

48. The method of claim 47, wherein the reactive species are generated from a fluorine-containing gas or a chlorine-containing gas.

49. The method of claim 48, wherein the fluorine-containing gas is selected from the group consisting of $F_2$, $NF_3$, $SF_6$, $C_2F_6$, $CF_4$, $C_3F_6$, and HF.

50. The method of claim 47, wherein light beam has a wavelength range from about 190 nm, to about 10 μm.

51. The method of claim 47, wherein the light beam has an energy density range from about 1 W/mm² to about 2 MW/mm².

52. The method of claim 47, wherein the light beam is focused or expanded.

53. The method of claim 47, wherein the light beam is a pulsed type or a continuous wave type.

54. A method for cleaning a process chamber, comprising the steps of:
introducing at least one fluorine-containing precursor gas to a remote chamber, wherein the remote chamber is connected to the interior of the process chamber;
activating the fluorine-containing precursor gas in the remote chamber to generate reactive species;
introducing the reactive species to the process chamber via a section connected to the chamber; and
applying at least one laser beam having a wavelength range from about 190 nm to about 10 um and an energy density range from about 1 kW/mm² to about 2 MW/mm² to the section, wherein the laser beam assists dissociation of the reactive species, thereby cleaning the process chamber.

55. The method of claim 54, wherein the fluorine-containing precursor gas is selected from the group consisting of $F_2$, $NF_3$, $SF_6$, $C_2F_6$, $C_4$, $C_3F_8$, and HF.

56. The method of claim 54, wherein the laser light beam is focused or expanded.

57. The method of claim 54, wherein the laser light beam is a pulsed type or a continuous wave type.

58. A method for cleaning a process chamber, comprising the steps of:
irradiating at least one laser beam to the interior of the process chamber, wherein the laser beam ablates residues from the process chamber; and
removing the process residues from the process chamber by introducing at least one carrier gas, thereby cleaning the process chamber.

59. The method of claim 58, wherein the laser beam(s) is a pulsed type or a continuous wave type.

60. The method of claim 58, wherein the laser beam(s) has a wavelength range from about 190 nm to about 10 μm.

61. The method of claim 58, wherein the laser beam(s) has an energy density range from about 1 kW/mm² to about 2 MW/mm².

62. The method of claim 58, wherein the carrier gas is selected from the group consisting of HF, $N_2$, Ar, $H_2$, and He.

63. A method for cleaning a process chamber, comprising the steps of:
irradiating at least one laser beam having a wavelength range from about 190 nm to about 10 μm and an energy density range from about 1 W/mm² to about 2 MW/mm² to the interior of the process chamber, wherein the laser beam ablates residues from the process chamber; and removing the process residues from the process chamber by introducing at least one carrier gas, thereby cleaning the process chamber.

64. The method of claim 63, wherein the laser beam(s) is a pulsed type or a continuous wave type.

65. The method of claim 63, wherein the carrier gas is selected from the group consisting of HF, $N_2$, Ar, $H_2$, and He.

* * * * *

UNITED STATES PATENT AND TRADEMARK OFFICE
CERTIFICATE OF CORRECTION

| | |
|---|---|
| PATENT NO. | : 6,811,615 B2 |
| APPLICATION NO. | : 09/866171 |
| DATED | : November 2, 2004 |
| INVENTOR(S) | : Sheng Sun |

It is certified that error appears in the above-identified patent and that said Letters Patent is hereby corrected as shown below:

Column 2, Line 15: Change "CF.sub.4, C.sub.2F.sub.6" to --$CF_4$, $C_2F_6$--

Column 2, Line 16: Change "NF.sub.3" to --$NF_3$--

Column 5, Line 13: Insert a period after "atoms"

Column 5, Lines 37-39 and 62-63, Column 6, Lines 32-33, and Column 7, Lines 14-15:

Change each occurrence of "F.sub.2, NF.sub.3, SF.sub.6, C.sub.2F.sub.6, CF.sub.4, C.sub.3F.sub.8" to --$F_2$, $NF_3$, $SF_6$, $C_2F_6$, $CF_4$, $C_3F_8$--

Column 9, Lines 57-58: Change "F.sub.2, NF.sub.3, SF.sub.6, C.sub.2F.sub.6 or CF.sub,4 to --$F_2$, $NF_3$, $SF_6$, $C_2F_6$, or $CF_4$--

Column 12, Line 18: Change "beam." to --beams(s).--

Column 12, Line 65: Insert -- $CF_4$-- after "$C_2F_6$,"

Column 14, Line 10: Change "$C_3F_6$" to --$C_3F_8$--

Column 14, Line 37: Change "$C_4$" to --$CF_4$--

Signed and Sealed this

Twenty-second Day of August, 2006

JON W. DUDAS
*Director of the United States Patent and Trademark Office*

UNITED STATES PATENT AND TRADEMARK OFFICE
CERTIFICATE OF CORRECTION

PATENT NO.       : 6,811,615 B2  
APPLICATION NO.  : 09/866171  
DATED            : November 2, 2004  
INVENTOR(S)      : Sheng Sun Page 1 of 1

It is certified that error appears in the above-identified patent and that said Letters Patent is hereby corrected as shown below:

Column 2, Line 15: Change "CF.sub.4, C.sub.2F.sub.6" to --$CF_4$, $C_2F_6$--

Column 2, Line 16: Change "NF.sub.3" to --$NF_3$--

Column 5, Line 13: Insert a period after "atoms"

Column 5, Lines 37-39 and 62-63, Column 6, Lines 32-33, and Column 7, Lines 14-15:

Change each occurrence of "F.sub.2, NF.sub.3, SF.sub.6, C.sub.2F.sub.6, CF.sub.4, C.sub.3F.sub.8" to --$F_2$, $NF_3$, $SF_6$, $C_2F_6$, $CF_4$, $C_3F_8$--

Column 9, Lines 57-58: Change "F.sub.2, NF.sub.3, SF.sub.6, C.sub.2F.sub.6 or CF.sub.4" to --$F_2$, $NF_3$, $SF_6$, $C_2F_6$, or $CF_4$--

Column 12, Line 18: Change "beam." to --beams(s).--

Column 12, Line 65: Insert -- $CF_4$-- after "$C_2F_6$,"

Column 14, Line 10: Change "$C_3F_6$" to --$C_3F_8$--

Column 14, Line 37: Change "$C_4$" to --$CF_4$--

This certificate supersedes Certificate of Correction issued August 22, 2006.

Signed and Sealed this

Second Day of January, 2007

JON W. DUDAS  
*Director of the United States Patent and Trademark Office*